US011450779B2

United States Patent
Campbell

(10) Patent No.: US 11,450,779 B2
(45) Date of Patent: Sep. 20, 2022

(54) OPTICALLY GATED TRANSISTOR LIGHT DETECTOR

(71) Applicant: BOISE STATE UNIVERSITY, Boise, ID (US)

(72) Inventor: Kristy A. Campbell, Boise, ID (US)

(73) Assignee: Boise State University, Boise, ID (US)

( * ) Notice: Subject to any disclaimer, the term of this patent is extended or adjusted under 35 U.S.C. 154(b) by 139 days.

(21) Appl. No.: 16/868,134

(22) Filed: May 6, 2020

(65) Prior Publication Data

US 2021/0351308 A1    Nov. 11, 2021

(51) Int. Cl.
*H01L 31/032*    (2006.01)
*H01L 31/02*    (2006.01)
*H01L 31/109*    (2006.01)

(52) U.S. Cl.
CPC .... *H01L 31/0324* (2013.01); *H01L 31/02019* (2013.01); *H01L 31/032* (2013.01); *H01L 31/109* (2013.01)

(58) Field of Classification Search
CPC ........... H01L 31/0324; H01L 31/02019; H01L 31/032; H01L 31/109
See application file for complete search history.

(56) References Cited

U.S. PATENT DOCUMENTS

| | | | | |
|---|---|---|---|---|
| 6,855,901 B1* | 2/2005 | Guenard | ................. | B07C 5/342 209/577 |
| 2004/0118448 A1* | 6/2004 | Scher | .................. | H01L 31/0384 136/252 |
| 2011/0273921 A1* | 11/2011 | Campbell | ............... | G11C 11/24 365/149 |

* cited by examiner

*Primary Examiner* — Georgia Y Epps
*Assistant Examiner* — Don J Williams
(74) *Attorney, Agent, or Firm* — Parsons Behle & Latimer

(57) ABSTRACT

An apparatus, system, and method for detecting light having a specified or first wavelength. The apparatus includes a substrate that generates charge separation in the presence of light having the first wavelength. An active material is deposited onto the substrate. The active material is configured to conduct current in the presence of light having a second wavelength. Two electrodes are connected to the active material. Light having the second wavelength is constantly applied to the active material and the current is monitored via the electrodes. The active material will conduct zero or minimal current via the electrodes if the substrate does not generate charge separation. Detection the presence of light having the first wavelength may be detected upon the detection of current via the two electrodes. The first wavelength may be non-visible light and the second wavelength may be visible light.

25 Claims, 4 Drawing Sheets

OPTICALLY GATED TRANSISTOR LIGHT DETECTOR

RELATED APPLICATIONS

This application hereby incorporates by reference the contents of U.S. patent application Ser. No. 15/990,067 filed on May 25, 2018, and entitled "Optically Activated Transistor, Switch, and Photodiode" and U.S. patent application Ser. No. 16/513,024 filed on Jul. 16, 2019, and entitled "Optically Gated Transistor Selector for Variable Resistive Memory Device" in their entities.

FIELD OF THE DISCLOSURE

The embodiments described herein relate to apparatus, systems, and methods for detecting light of a first wavelength by detecting current from electrodes connected to an active material onto which a light having a second wavelength is applied.

DESCRIPTION OF THE RELATED ART

In some applications it may be important to detect the presence of light. For example, it may be important to detect the presence of non-visible light such as ultraviolet (UV) light or infrared (IR) light. It is known that various materials generate charge separation when a range of wavelength of light is applied to the material under certain environmental conditions. FIG. 4 is a graph that shows various materials that generate charge separation under a specified range of wavelengths of light. However, these materials typically have to be maintained at very cold temperatures such as 4.2K and 193K. Such cold temperatures may cause the use of such materials as light detectors to be impractical. It may be beneficial to be able to use these materials in a different environment to detect non-visible wavelengths of light. Other disadvantages may exist.

SUMMARY

The present disclosure is directed to methods, apparatus, and systems that address at least some of the problems and disadvantages discussed above. It would be beneficial to provide an optically gate transistor (OGT) device to be used as a detector for various wavelengths of light.

One embodiment is a detector device comprising a substrate that generates charge separation in a presence of light having a first wavelength. The detector device includes an active material on the substrate, a first electrode electrically connected to the active material, and a second electrode electrically connected to the active material. The active material conducts current bidirectionally in a presence of light having a second wavelength when light having the first wavelength is applied to a portion of the substrate.

The first wavelength may be non-visible light and the second wavelength may be visible light. In another embodiment, the first wavelength and the second wavelength may both be non-visible length. In another embodiment, the first wavelength and the second wavelength may both be visible light. The substrate may comprise indium antimonide (InSb) and the first wavelength may be approximately 3 μm to approximately 7 μm. The substrate may comprise lead selenide (PbSe) and the first wavelength may be approximately 1.25 μm to approximately 4.5 μm. The substrate may comprise germanium zinc (GeZn) and the first wavelength may be approximately 12 μm to approximately 40 μm.

The active material may comprise a first layer comprised of germanium selenide. The active material may comprise a second layer of germanium selenide and another element. The active material may comprise a third layer comprised of germanium selenide with the second layer being positioned between the first layer and the third layer. The active layer may comprise a fourth layer comprising germanium selenide and the element with the third layer being positioned between the second layer and the fourth layer. The active layer may comprise a fifth layer comprising germanium selenide with the fourth layer being positioned between the third layer and the fifth layer. The germanium selenide may further comprise $Ge_2Se_3$. The other element may be lead (Pb), silicon (Si), manganese (Mn), tin (Sn), aluminum (Al), carbon (C), Chromium (Cr), Tungsten (W), Titanium (Ti), or copper (Cu).

One embodiment of the present disclosure is a system comprising a substrate that generates charge separation in a presence of light having a first wavelength and an active material on the substrate. The system includes a first electrode electrically connected to the active material and a second electrode electrically connected to the active material. The active material conducts current in a presence of light having a second wavelength when light having the first wavelength is applied to a portion of the substrate. The system includes a device electrically connected to the first electrode and electrically connected to the second electrode, wherein the device indicates the presence of the first wavelength of light via detection of current from the first and second electrodes.

The device may be an amplifier. The first wavelength may be non-visible light and the second wavelength may be visible light. The active material may be one or more layers of germanium selenide and one or more layers of germanium selenide and an element.

One embodiment of the present disclosure is a method of detecting light having a first wavelength. The method comprising providing a substrate, wherein the substrate generates charge separation in a presence of light having the first wavelength. The method includes providing an active material connected to the substrate. The method includes providing a first electrode electrically connected to the active material and providing a second electrode electrically connected to the active material. The method includes applying a light having a second wavelength to the active material and detecting whether light having the first wavelength is applied to the substrate by detecting an electrical current from the first and second electrodes.

The first wavelength may be non-visible light and the second wavelength may be visible light. In another embodiment, the first wavelength and the second wavelength may both be non-visible length. In another embodiment, the first wavelength and the second wavelength may both be visible light. The active material may comprise one or more layers of germanium selenide and one or more layers of germanium selenide and another element. The other element may be lead (Pb), silicon (Si), manganese (Mn), tin (Sn), aluminum (Al), carbon (C), Chromium (Cr), Tungsten (W), Titanium (Ti), or copper (Cu).

Figure 1:
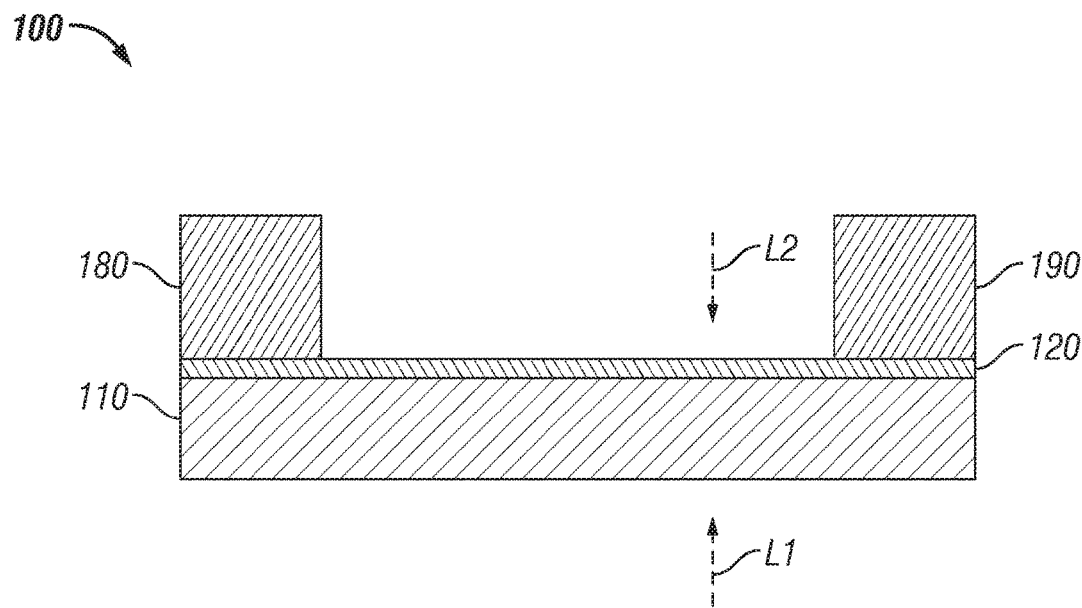
FIG. 1 is a schematic of an embodiment of an apparatus that may be used to detect the presence of light having a specified wavelength.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

FIG. 1 shows an embodiment of an apparatus 100 that may be used to detect the presence of light having a specified wavelength. The apparatus 100 includes a substrate 110 and an active material 120 deposited onto the substrate. The substrate 110 is comprised of a material that generates charge separation upon the application, or presence of, light L1 have a first wavelength. In the absence of light L1, the substrate 110 does not generate charge separation. The first wavelength of light L1 may be non-visible light such as UV light or IR light.

The substrate 110 may be comprised of various materials configured to detect the presence of a specified wavelength of light as would be appreciated by one of ordinary skill in the art having the benefit of this disclosure. For example, the substrate 110 may be comprised of indium antimonide (InSb), which generates charge separation upon the application of light having wavelength of approximately 3 μm to approximately 7 μm. As another example, the substrate 110 may be comprised of lead selenide (PbSe), which generates charge separation upon the application of light having a wavelength of approximately 1.25 μm to approximately 4.5 μm. As yet another example, the substrate may be comprised of germanium zinc (GeZn), which generates charge separation upon the application of light having a wavelength of approximately 12 μm to approximately 40 μm. The material of the substrate 110 is not limited to these materials as would be appreciated by one of ordinary skill in the art having the benefit of this disclosure.

The use of an active material 120 eliminates the need to maintain the substrate 110 at the known cold temperatures as discussed herein. The active material 120 is configured to conduct current in the presence of light L2 having a second wavelength. For example, the second wavelength may be visible light. A first electrode 180 and a second electrode 190 are electrically connected to the active material 120 and may be used to determine whether current is being conducted by the active material 120. The active material 120 may comprise any material configured to conduct current in the application of light L2 having the second wavelength, which is preferably visible light. The active material 120 may be the active material disclosed in U.S. patent application Ser. No. 15/990,067 filed on May 25, 2018, and entitled "Optically Activated Transistor, Switch, and Photodiode" or U.S. patent application Ser. No. 16/513,024 filed on Jul. 16, 2019, and entitled "Optically Gated Transistor Selector for Variable Resistive Memory Device."

As discussed herein, the active material 120 conducts current upon the application of a light L2 having a second wavelength onto the active material 120. However, the active material 120 will not conduct current, or the amount will be miniscule, if the substrate 110 does not generate charge separation. Thus, the apparatus 100 will not conduct current unless light L2 having the second wavelength is applied to the active material 120 and light L1 having the first wavelength is also applied to the substrate 110.

The apparatus 100 may be used to detect the presence of light L1 having the first wavelength as discussed herein. Light L2 having a second wavelength may be constantly applied to the active material 120 and the electrical current of the apparatus 100 may be monitored via the first electrode 180 and the second electrode 190. Detection of electrical current, or alternatively detection of electrical current above a minimal threshold, from the apparatus 100 indicates the presence of light L1 having the first wavelength due to the generation of charge separation of the substrate 110 enabling the conduction of current from the apparatus 100. When the first wavelength is non-visible light, such as IR light or UV light, and the second wavelength length is visible light, the apparatus 100 used visible light to detect the presence of IR or UV light.

Figure 2:
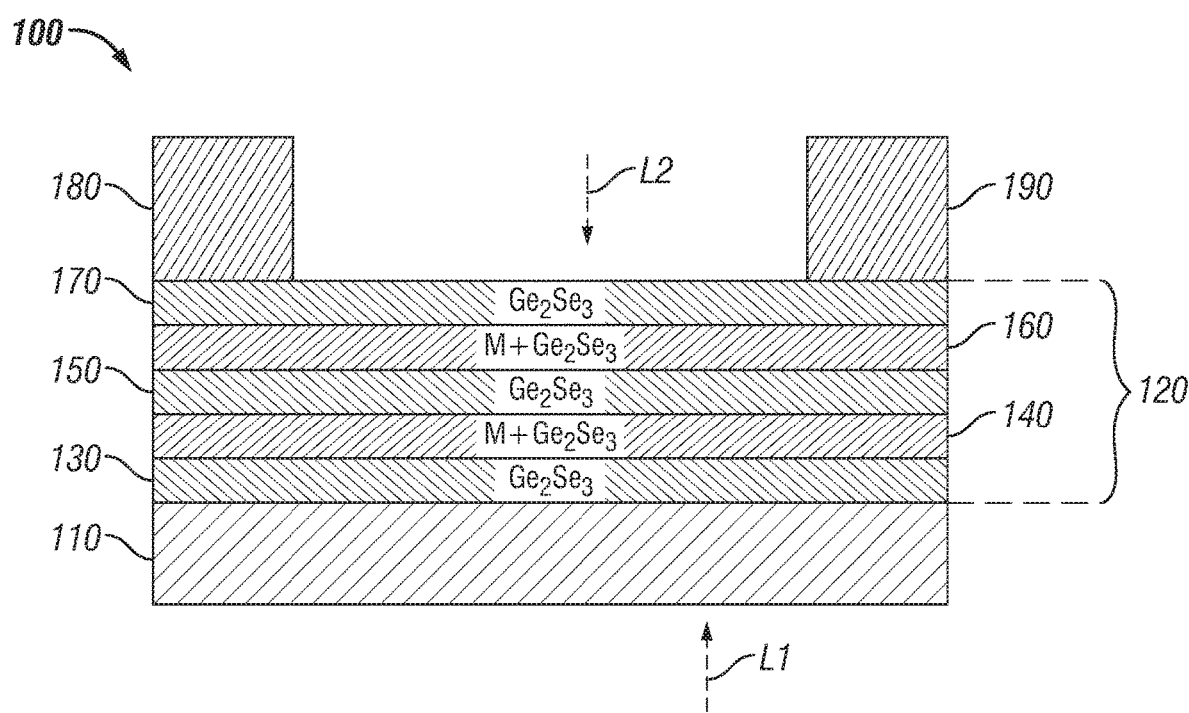
FIG. 2 is a schematic of an embodiment of an apparatus that may be used to detect the presence of light having a specified wavelength.

FIG. 2 shows an embodiment of an apparatus 100 that may be used to detect the presence of light having a specified wavelength. The apparatus 100 includes a substrate 110 and an active material 120 deposited onto the substrate 110. The substrate 110 is comprised of a material that generates charge separation upon the application, or presence of, light L1 have a first wavelength. In the absence of light L1, the substrate 110 does not generate charge separation. The first wavelength of light L1 may be non-visible light such as UV light or IR light.

The active material 120 may be comprised of a first layer 130, a second layer 140, a third layer 150, a fourth layer 160, and a fifth layer 170. The second layer 140 being positioned between the first layer 130 and the third layer 150. The third layer 150 being positioned between the second layer 140 and the fourth layer 160. The fourth layer 160 being positioned between the third layer 150 and the fifth layer 170. A first electrode 180 and a second electrode 190 are connected to the fifth layer 170 of the active material 120.

The first layer 130, the third layer 150, and the fifth layer 170 may each be comprised of germanium selenide. Various stoichiometries of germanium selenide may be used depending on desired response as would be appreciated by one of ordinary skill in the art having the benefit of this disclosure. In one embodiment, the germanium selenide may be $Ge_2Se_3$. The first layer 130, the third layer 150, and the fifth layer 170 may each be comprised of $Ge_2Se_3$. The second layer 140 and the fourth layer 160 may each be comprised of germanium selenide plus an additional element. The additional element may be, but is not limited to, lead (Pb), silicon (Si), manganese (Mn), tin (Sn), aluminum (Al), carbon (C), Chromium (Cr), Tungsten (W), Titanium (Ti), or copper (Cu). The second layer 140 and the fourth layer 160 may be $Ge_2Se_3$ with an additional element. The active material 120 may comprise more, or less, alternating layers of germanium selenide and germanium selenide plus an additional element depending on the application as would be appreciated by one of ordinary skill in the art having the benefit of this disclosure. The presence of alternating layers of germanium selenide and germanium selenide plus an additional element in the active material 120 will cause the active material to conduct current in the presence of light L2 having a second wavelength, such as visible light, if the substrate 110 also is configured to conduct electrical current. Thus, the apparatus 100 may be used to detect the presence of light L2 having a first wavelength when the apparatus 100 conducts current via the electrodes 180, 190.

Figure 3:
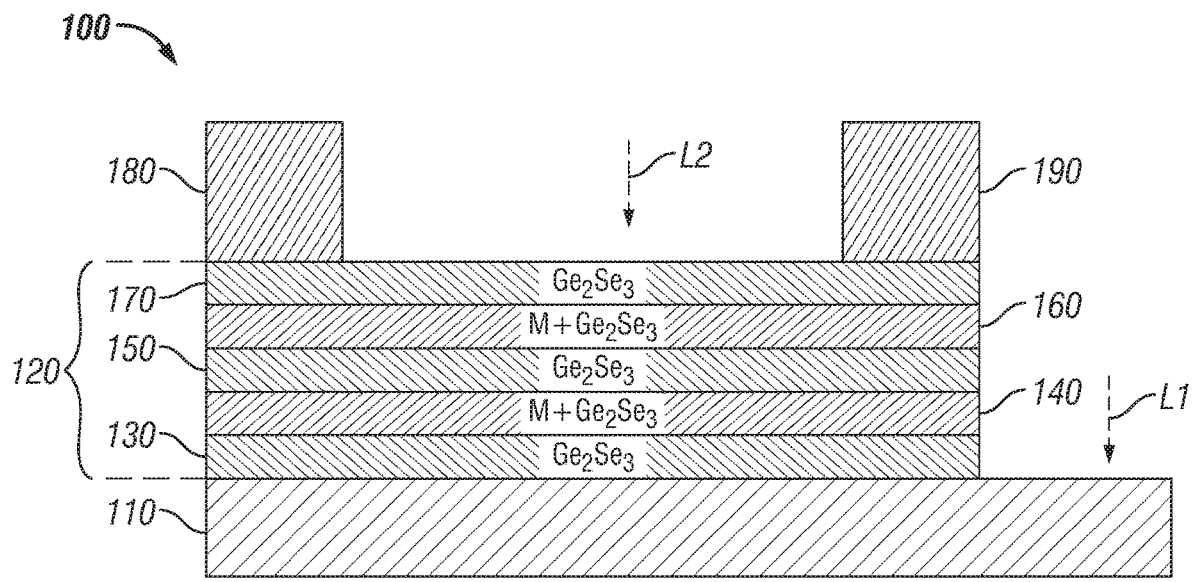
FIG. 3 is a schematic of an embodiment of an apparatus that may be used to detect the presence of light having a specified wavelength.

FIG. 3 shows an embodiment of an apparatus 100 that may be used to detect the presence of light having a specified wavelength. The apparatus 100 includes a substrate 110 and an active material 120 deposited onto the substrate. The substrate 110 is comprised of a material that generates charge separation upon the application, or presence of, light L1 have a first wavelength. In the absence of light L1, the substrate 110 does not generate charge separation. The first wavelength of light L1 may be non-visible light such as UV light or IR light. The substrate 110 may extend beyond the perimeter of the active material 120 to better detect the presence of light L1 having the first wavelength.

As discussed herein, the active material 120 may be comprised of a first layer 130, a second layer 140, a third layer 150, a fourth layer 160, and a fifth layer 170. The second layer 140 being positioned between the first layer 130 and the third layer 150. The third layer 150 being positioned between the second layer 140 and the fourth layer 160. The fourth layer 160 being positioned between the third layer 150 and the fifth layer 170. A first electrode 180 and a second electrode 190 are connected to the fifth layer 170 of the active material 120. The layers 130-170 may be alternating layers of germanium selenide and germanium selenide plus an additional element.

Figure 5:
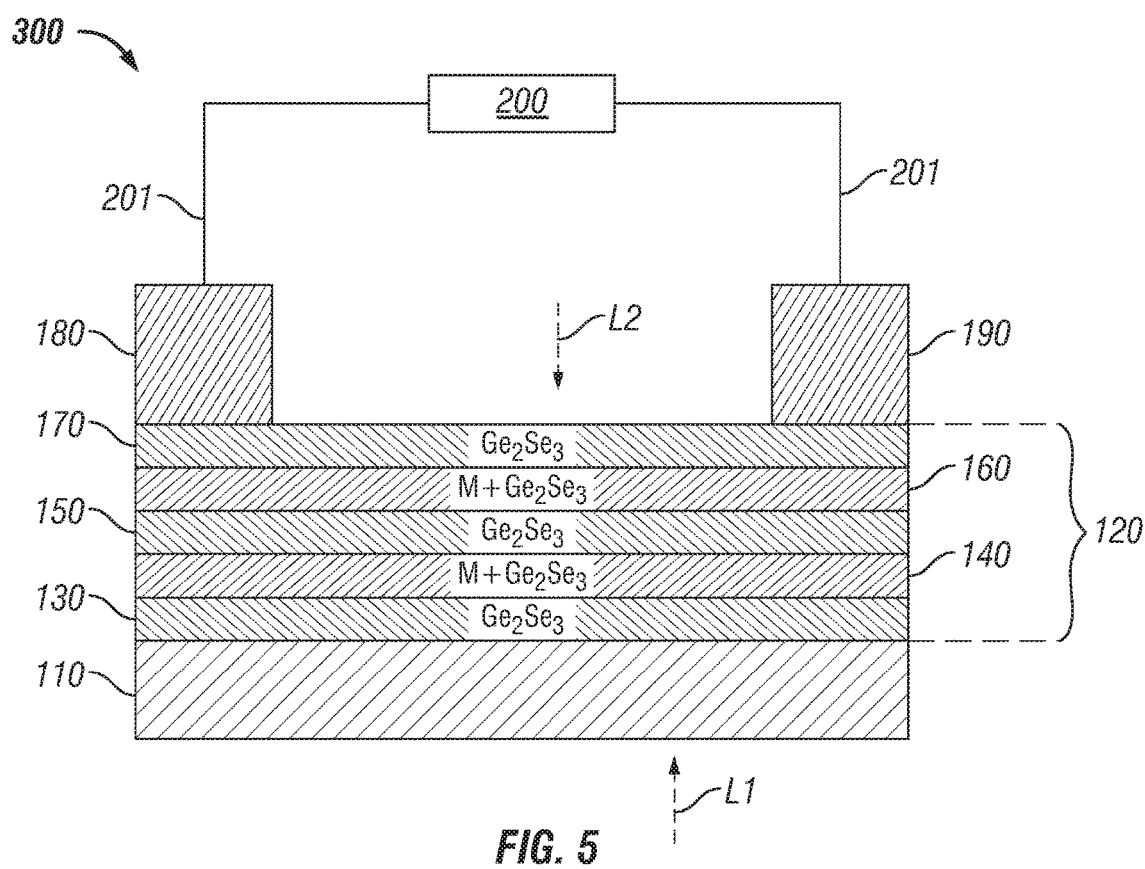
FIG. 5 is a schematic of an embodiment of a system that may be used to detect the presence of light having a specified wavelength.
Figure 4:
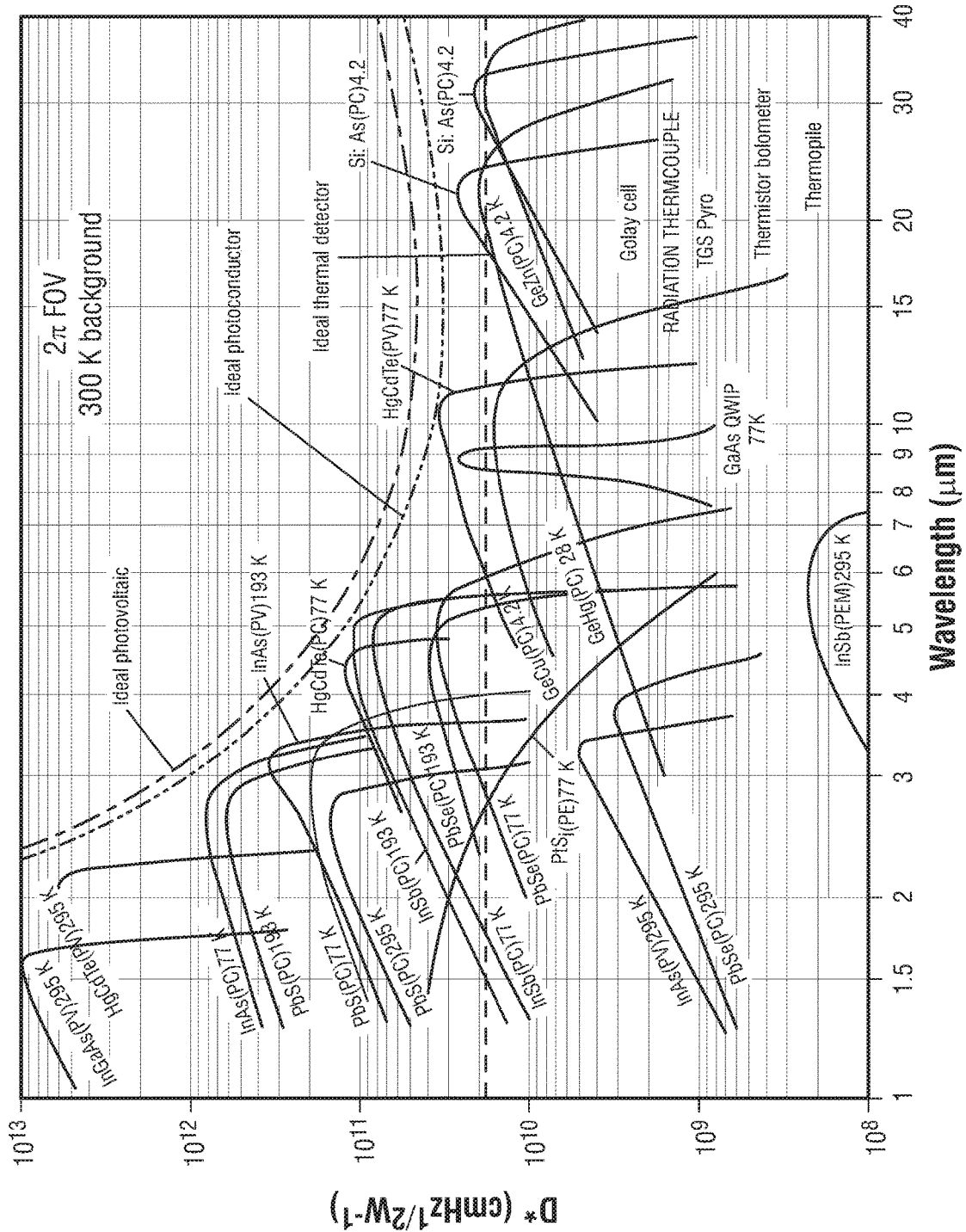
FIG. 4 is a graph showing various materials that generate charge separation upon the application of specific wavelengths of light at specified temperatures.

FIG. 5 shows a system 300 that may be used to detect the presence of light having a specified wavelength. The system 300 includes a device 200 that is electrically connected via wires 201 to electrodes 180, 190. As discussed herein, electrodes 180, 190 will conduct current when both the active material 120 conducts current and the substrate 110 generates charge separation. The active material 120 conducts current in the presence of light L2 having the second wavelength, but such current will only be detected via the device 200 when the substrate 110 generates charge separation. As discussed herein, the substrate 110 only generates charge separation in the presence of light L1 having the first wavelength, which may be a wavelength of non-visible light. The material of the substrate 110 may be configured to detect a specified wavelength of light as would be appreciated by one of ordinary skill in the art having the benefit of this disclosure.

Figure 6:
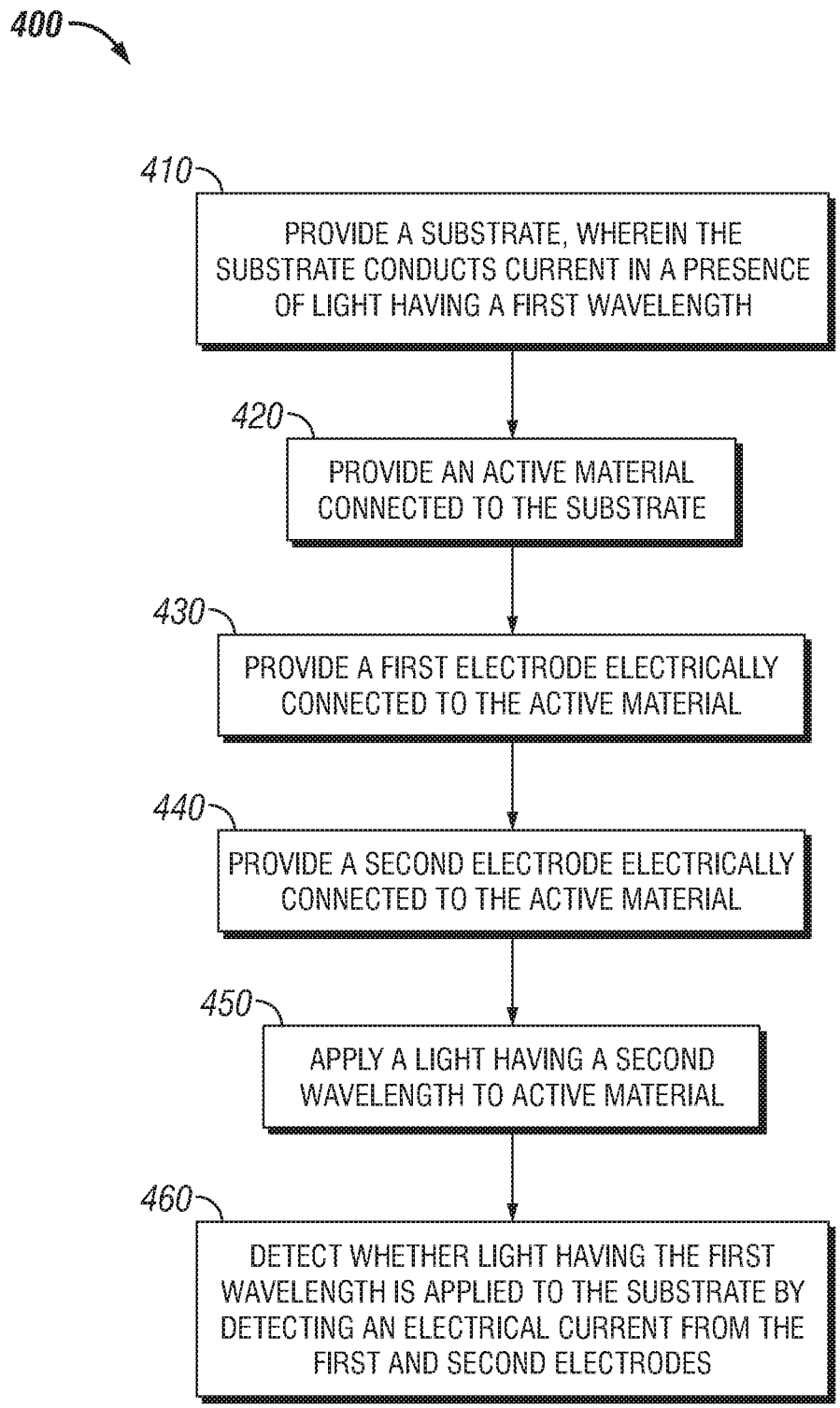
FIG. 6 is a flow chart of an embodiment of a method of detecting light having a specified wavelength.

FIG. 6 is a flow chart of an embodiment of method 400 of detecting light having a first specific wavelength. The method 400 includes providing a substrate, wherein the substrate generates charge separation in a presence of light having a first wavelength, at 410. The method 400 includes providing an active material connected to the substrate, at 420. The method 400 includes providing a first electrode electrically connected to the active material, at 430. The method 400 includes providing a second electrode electrically connected to the active material, at 440.

The method 400 includes applying a light having a second wavelength to the active material, at 450. The active material is configured to conduct current upon the application of light having a second wavelength. The method 400 includes detecting whether light having the first wavelength is applied to the substrate by detecting an electrical current from the first and second electrodes, at 460.

Although this disclosure has been described in terms of certain preferred embodiments, other embodiments that are apparent to those of ordinary skill in the art, including embodiments that do not provide all of the features and advantages set forth herein, are also within the scope of this disclosure. Accordingly, the scope of the present disclosure is defined only by reference to the appended claims and equivalents thereof

What is claimed is:

1. A detector device comprising:
   a substrate, the substrate generates charge separation in a presence of light having a first wavelength;
   an active material on the substrate;
   a first electrode electrically connected to the active material; and
   a second electrode electrically connected to the active material, wherein the active material conducts current bidirectionally in the presence of light having a second wavelength when light having the first wavelength is applied to a portion of the substrate.

2. The detector device of claim 1, wherein the first wavelength comprises non-visible light and the second wavelength comprises visible light.

3. The detector device of claim 2, wherein the substrate comprises indium antimonide (InSb) and the first wavelength comprises approximately 3 μm to approximately 7 μm.

4. The detector device of claim 2, wherein the substrate comprises lead selenide (PbSe) and the first wavelength comprises approximately 1.25 μm to approximately 4.5 μm.

5. The detector device of claim 2, wherein the substrate comprises germanium zinc (GeZn) and the first wavelength comprises approximately 12 μm to approximately 40 μm.

6. The detector device of claim 2, wherein the active material comprises a first layer comprised of germanium selenide.

7. The detector device of claim 6, wherein the active material comprises a second layer comprising germanium selenide and an element.

8. The detector device of claim 7, wherein the active material comprises a third layer comprised of germanium selenide, wherein the second layer is positioned between the first layer and the third layer.

9. The detector device of claim 8, wherein the active material comprises a fourth layer comprising germanium selenide and the element, wherein the third layer is positioned between the second layer and the fourth layer.

10. The detector device of claim 9, wherein the active material comprises a fifth layer comprising germanium selenide, wherein the fourth layer is positioned between the third layer and the fifth layer.

11. The detector device of claim 10, wherein the germanium selenide further comprises $Ge_2Se_3$.

12. The detector device of claim 11, wherein the element comprises lead (Pb), silicon (Si), manganese (Mn), tin (Sn), aluminum (Al), carbon (C), Chromium (Cr), Tungsten (W), Titanium (Ti), or copper (Cu).

13. The detector device of claim 1, wherein the active material is positioned between the substrate and both the first electrode and the second electrode.

14. A system comprising:
    a substrate, the substrate generates charge separation in a presence of light having a first wavelength;
    an active material on the substrate;
    a first electrode electrically connected to the active material;

a second electrode electrically connected to the active material, wherein the active material conducts current in a presence of light having a second wavelength when light having the first wavelength is applied to a portion of the substrate; and a device electrically connected to the first electrode and electrically connected to the second electrode, wherein the device indicates the presence of the light having the first wavelength via detection of current from the first and second electrodes.

15. The system of claim 14, wherein the device is an electrical amplifier.

16. The system of claim 14, wherein the first wavelength comprises non-visible light and the second wavelength comprises visible light.

17. The system of claim 14, wherein the active material comprises one or more layers of germanium selenide and one or more layers of germanium selenide and an element.

18. The system of claim 14, wherein a portion of the substrate extends beyond an outer perimeter of the active material.

19. A method of detecting light having a first wavelength comprising:

providing a substrate, wherein the substrate generates charge separation in a presence of light having the first wavelength;

providing an active material connected to the substrate;

providing a first electrode electrically connected to the active material;

providing a second electrode electrically connected to the active material;

applying a light having a second wavelength to the active material; and detecting whether light having the first wavelength is applied to the substrate by detecting an electrical current from the first and second electrodes.

20. The method of claim 19, wherein the first wavelength is non-visible light and the second wavelength is visible light.

21. The method of claim 20, wherein the active material comprises one or more layers of germanium selenide and one or more layers of germanium selenide and an element.

22. The method of claim 21, wherein the element comprises lead (Pb), silicon (Si), manganese (Mn), tin (Sn), aluminum (Al), carbon (C), Chromium (Cr), Tungsten (W), Titanium (Ti), or copper (Cu).

23. The method of claim 19, wherein the first wavelength is non-visible light and the second wavelength is non-visible light.

24. The method of claim 19, wherein the first wavelength is visible light and the second wavelength is visible light.

25. The method of claim 19, further comprising providing the active material be positioned between the substrate and both the first and second electrodes.

* * * * *